US008269222B2

(12) United States Patent  
Shen et al.

(10) Patent No.: US 8,269,222 B2
(45) Date of Patent: Sep. 18, 2012

(54) SEMICONDUCTOR PHOTODETECTOR WITH TRANSPARENT INTERFACE CHARGE CONTROL LAYER AND METHOD THEREOF

(75) Inventors: Paul Shen, Potomac, MD (US); Michael Wraback, Germantown, MD (US); Anand V Sampath, Montgomery Village, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/114,254

(22) Filed: May 24, 2011

(65) Prior Publication Data

US 2011/0291108 A1 Dec. 1, 2011

Related U.S. Application Data

(60) Provisional application No. 61/348,141, filed on May 25, 2010.

(51) Int. Cl.
*H01L 29/15* (2006.01)
(52) U.S. Cl. .......................................... 257/77; 438/105
(58) Field of Classification Search .................... 257/77; 438/105
See application file for complete search history.

(56) References Cited

U.S. PATENT DOCUMENTS

| 4,935,795 | A | 6/1990 | Mikawa et al. |
| 6,326,654 | B1 | 12/2001 | Ruden et al. |
| 6,838,741 | B2 | 1/2005 | Sandvik et al. |
| 7,049,640 | B2 | 5/2006 | Boisvert et al. |
| 2004/0108530 | A1 | 6/2004 | Sandvik et al. |
| 2005/0098844 | A1 | 5/2005 | Sandvik et al. |

FOREIGN PATENT DOCUMENTS

| EP | 0082787 | 6/1983 |
| EP | 0150564 | 8/1985 |
| EP | 2175497 A2 | 4/2010 |

OTHER PUBLICATIONS

Hawkins, A., "High Gain-bandwidth-product Silicon Heterointerface Photodetector," Applied Physics Letter, 70 (3) 20 (Jan. 1997), pp. 303-305.
Campbell, J. C., "Recent advances in telecommunications avalanche photodiodes," J. of Lightwave Tech., vol. 25, No. 1, p. 109-121, Jan. 2007.
M. Liu, et al. "Low dark count rate and high single-photon detection efficiency avalanche photodiode in Geiger-mode operation," IEEE Phot. Tech. Lett. 19, 378-80, (2007).

(Continued)

*Primary Examiner* — Douglas Menz
(74) *Attorney, Agent, or Firm* — Lawrence E. Anderson

(57) ABSTRACT

A detection device comprising a photodetector comprising a first semiconductor layer through which light first enters the photodetector; the first semiconductor layer formed of a first semiconductor material crystal lattice which terminates at an interface creating a first interface charge; the first semiconductor layer being an absorption layer in which photons in a predetermined wavelength range are absorbed and create photogenerated carriers; and a second polar semiconductor layer deposited on the crystal lattice of the first semiconductor layer substantially transparent to light in the predetermined wavelength range and having a total polarization different from the first semiconductor layer so that a second interface charge is induced at the interface between the first and second semiconductor layers; the induced second interface charge reduces or substantially cancels the first interface charge so as to increase the collection of photogenerated carriers by the photodetector. ; and a method providing the above.

20 Claims, 20 Drawing Sheets

| 1 | 2 | 3 | 4 |

⇐ LIGHT OR OTHER ELECTROMAGNETIC RADIATION

OTHER PUBLICATIONS

J. B. Limb et al., "GaN ultraviolet avalanche photodiodes with optical gain greater than 1000 grown on GaN substrates by metal-organic chemical vapor deposition" Appl. Phys. Lett 89, 011112 (2006).

Danielsson, E., et al. "The influence of band offsets on the IV characteristics for GaN/SiC heterojunctions," Sol. State Electron., vol. 46, pp. 827-835, (2002).

Konstantinov, A. O., et al. "Ionization rates and critical fields in 4H silicon carbide," Appl. Phys. Lett., vol. 71, No. 1, pp. 90-92, 1997.

Vurgaftman, I., et al. "Band Parameters for Nitrogen-containing Semiconductors," J. Appl. Phys. 2003, 94, 3675-96.

S. Bai et al, "Determination of the Electric Field in 4H/3C/4H-SiC Quantum Wells Due to Spontaneous Polarization in the 4H SiC Matrix" Appl. Phys. Lett. 2003, 83, 3171-3173.

Perry, W.G., et al, "Correlation of biaxial strains, bound exciton energies, and defect microstructures in gan films grown on AlN/6H-SiC(0001) substrates," Journal Electron, Mater. 26, 224 (1997).

Gou, X., "Demonstration of Ultraviolet Separate Absorption and Multiplication 4H-SiC Avalanche Photodiodes," IEEE Photonics Technology Letters, vol. 18, No. 1, pp. 136-138 (2006).

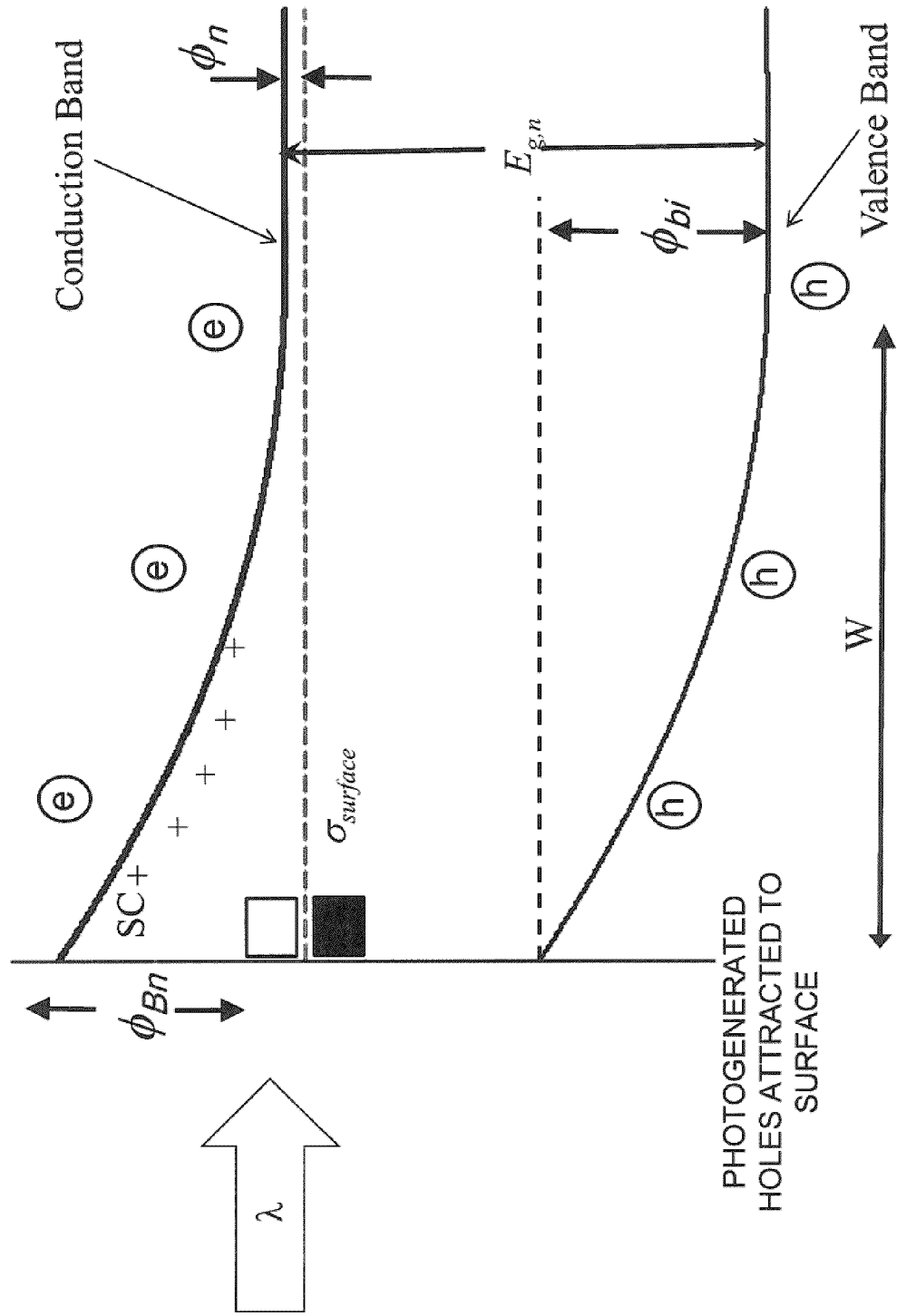

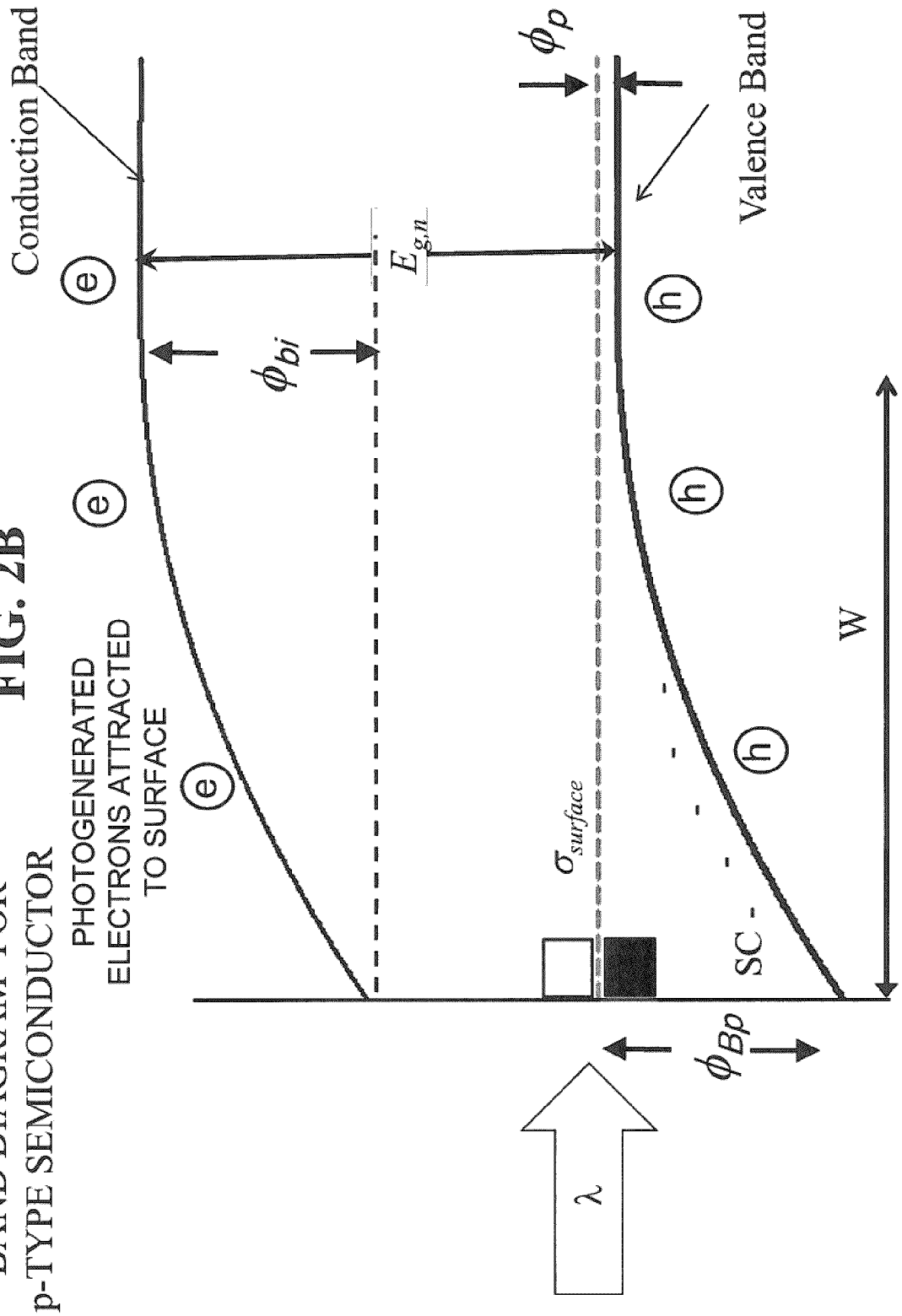

P2 > P1 such that the positive induced polarization charge cancels the negative surface charge density ($\sigma_{surface}$) associated with the density of surface states in the semiconductor layer.

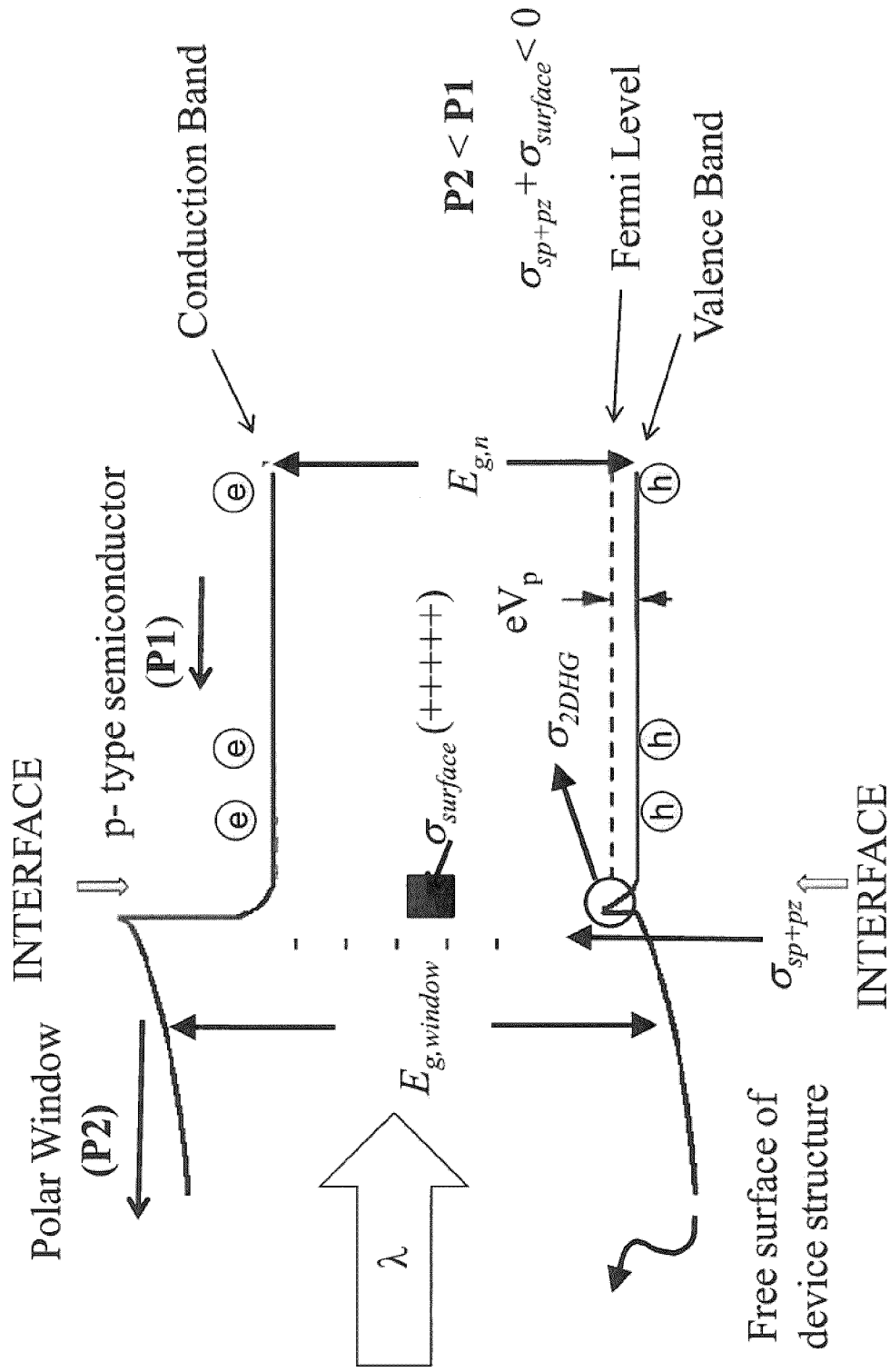

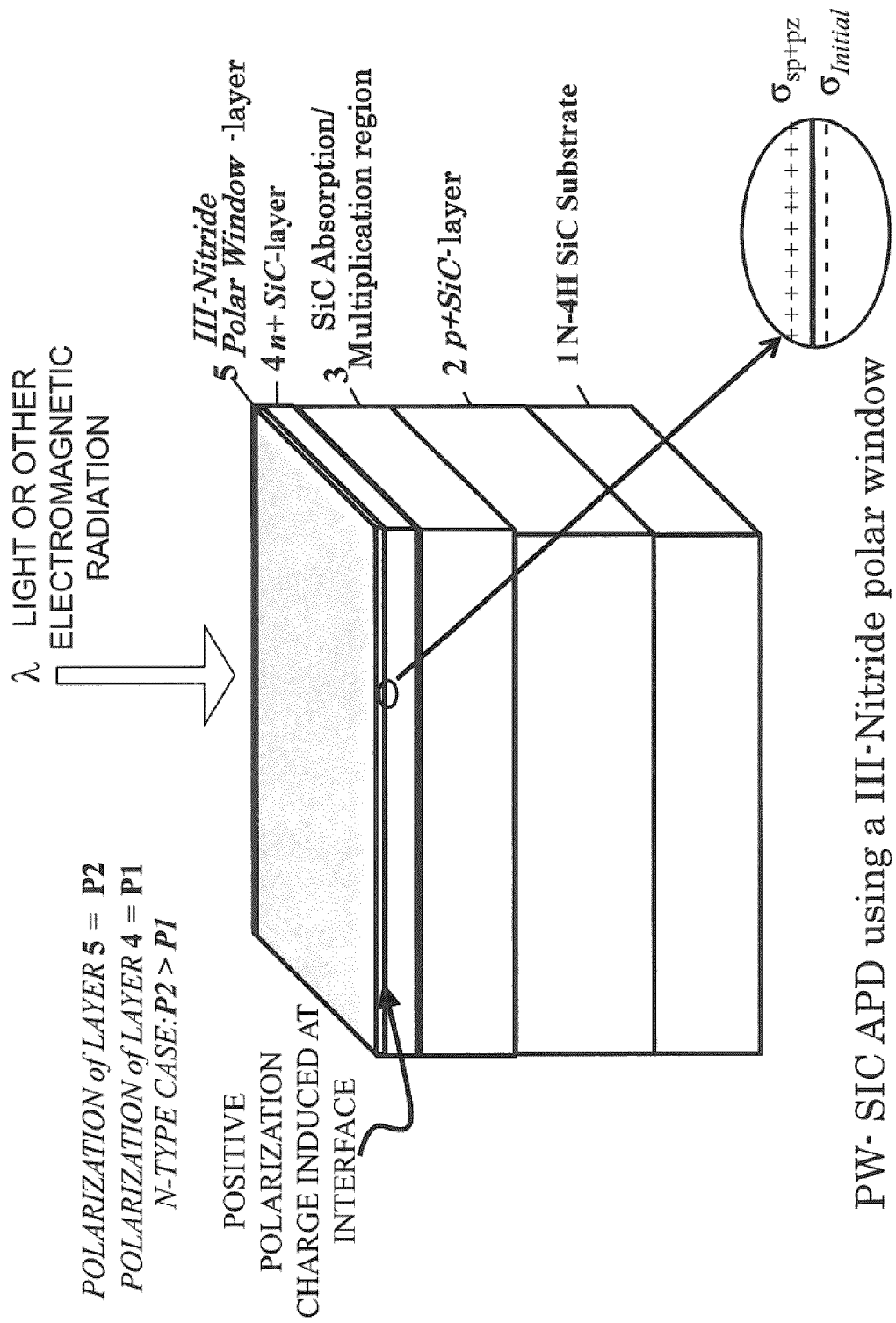
FIG. 4 PW- SIC APD using a III-Nitride polar window

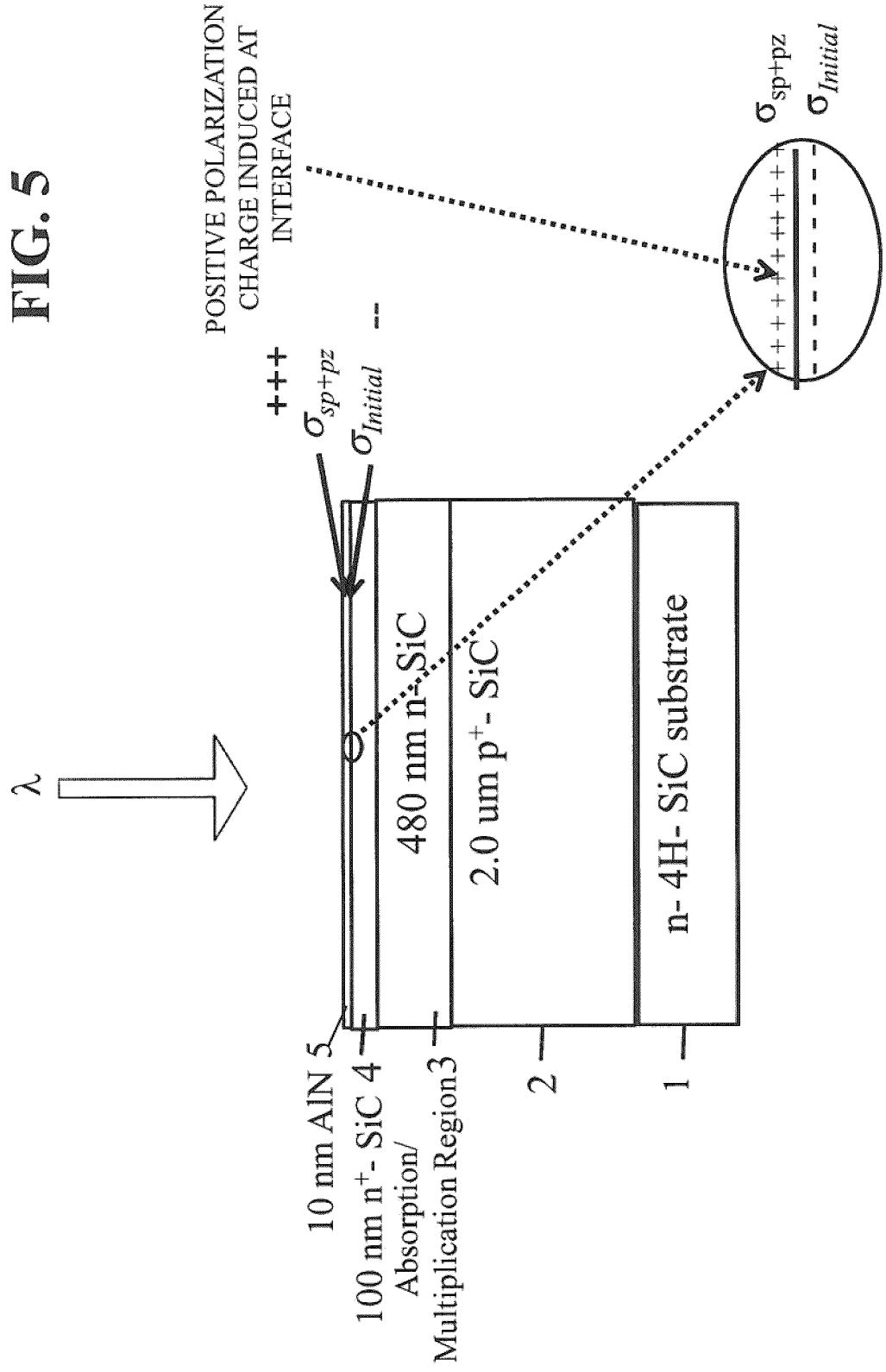

Scanning Electron Micrograph of a fabricated AlN PW-SiC APD

Measured quantum efficiency of a SiC APD with and without a AlN polar window

Figure 8. Measured IV Characteristics and Gain from fabricated AlN-PW SiC APD

P2 < P1, p-type semiconductor adjacent window

LATERAL CONTACT PHOTODIODE STRUCTURE

P2 > P1, n-type semiconductor adjacent window

AT LEAST ONE ELECTRICAL CONTACT IS MADE THROUGH POLAR WINDOW

VERTICAL CONTACT PHOTODIODE STRUCTURE

FIG. 16    P2 > P1, n-type semiconductor adjacent window

VERTICAL CONTACT PHOTODIODE STRUCTURE

SEMICONDUCTOR PHOTODETECTOR WITH TRANSPARENT INTERFACE CHARGE CONTROL LAYER AND METHOD THEREOF

CROSS-REFERENCE TO RELATED APPLICATIONS

This application claims priority of U.S. Provisional Application No. 61/348,141 filed May 25, 2011, entitled "Polar Semiconductor Photodetector with Transparent Interface Charge Control Layer System and Method Thereof," hereby incorporated by reference.

The embodiments herein may be manufactured, used, and/or licensed by or for the United States Government without the payment of royalties thereon.

BACKGROUND OF THE INVENTION

In general, desirable features of interest for photodetectors include improved response times and low noise; particularly in optical systems. One type of photodetector of particular interest for use in optical systems is the avalanche photodetector (APD). Avalanche photodetectors exhibit current gain due to avalanche multiplication as discussed further in European Patent Publication No. 0150564 (hereinafter '564 Publication), published Aug. 7, 1985, entitled "Electronic Device Comprising a Heterojunction" listing as inventors F. Cappasso and A. Cho, hereby incorporated by reference as though, fully rewritten herein. The '564 Publication relates to heterojunction photodetectors including avalanche photodetectors having separate absorption and multiplication regions; particularly Group III-V compound semiconductors, such as $Ga_{0.47}IN_{0.53}As$, as the light absorbing material which is grown lattice matched to a substrate comprising a Group III-V semiconductor such as InP.

SUMMARY

A preferred embodiment comprises a polar semiconductor layer formed on an initial (or illumination) semiconductor-layer of a photodetector. The initial (or illumination) semiconductor layer is formed of a semiconductor material crystal lattice which discontinues or terminates to form an interface. The discontinuity or termination of the initial semiconductor crystal lattice at the interface induces or creates an initial interface charge, $\sigma_{init}$, which is comprised of the charge in surface states, $\sigma_{surface}$, plus the polarization charge, $\sigma_{pol}$, which may have both spontaneous ($\sigma_{sp}$) and piezoelectric ($\sigma_{pz}$) components ($\sigma_{pol}=\sigma_{sp}+\sigma_{pz}$) in polar semiconductor materials. The interface charge results in a depletion region near the interface with band bending that traps minority carriers photogenerated near the interface. Since the initial semiconductor layer is an absorption layer in which photons in a predetermined wavelength range are absorbed to thereby generate carriers, this interface charge interferes with the collection of photogenerated carriers created near the interface by high energy photons with short absorption length and energy substantially larger than the bandgap of the initial (or illumination) semiconductor layer. A preferred method comprises the formation of a polar semiconductor layer on an initial or illumination semiconductor layer of a photodetector. The additional polar semiconductor layer, grown on the crystal lattice of the initial semiconductor layer, is substantially transparent to light within the spectrum of interest so that substantially no or relatively few photo carriers are generated within it due to these photons. The total polarization of this added layer is different from the first semiconductor layer so that a second interface charge is induced at the interface between the added and initial semiconductor layers, and the induced second interface charge reduces or substantially cancels the initial interface charge $\sigma_{init}$.

In a preferred embodiment the layer formed on the initial or illumination layer may be referred to as a polar "window" layer, comprising a substantially transparent interface charge control layer; in the sense that it has both a larger band gap than the absorption region of the photodetector and a different total polarization (spontaneous and/or piezoelectric) than the adjacent illuminated surface of the photodetector subassembly (depicted schematically in FIG. 1). Alternately, the "window" layer could have a smaller indirect band gap with absorption weak enough for most of the electromagnetic radiation to pass therethrough. This preferred embodiment has the significant advantage that the discontinuity in polarization at the hetero-interface (between the polar "window" and the photodetector subassembly) induces an interface charge that offsets the initial surface/interface charge $\sigma_{init}$ in the photodetector thereby suppressing the depletion layer and increasing the quantum efficiency of the detector at short wavelengths (i.e., for high energy photons).

In a preferred embodiment photodetector illuminated through a n-type semiconductor layer having total polarization $\overline{P}1$ and a negative $\sigma_{init}$, a larger band gap semiconductor "window" layer having a larger total polarization $\overline{P}2$ than the n-type semiconductor is placed (or located) adjacent to the photodetector subassembly, whereby a positive polarization interface charge is formed (at interface between the polar window and detector subassembly as shown in FIG. 3). As used herein the term $\overline{P}$ in bold face represents a polarization vector quantity having both magnitude and direction. Using the principles of the present invention, this charge can be sufficient to cancel the negative $\sigma_{init}$ and eliminate the depletion region near the interface in the n-type semiconductor (FIG. 3; layer 4 in FIG. 4). As a result, photogenerated holes are repelled from rather than attracted to the interface of the n-type semiconductor and the polar "window" layer, and the high photon energy (short wavelength) quantum efficiency of the photodetector is increased. An analogous case occurs for a photodetector illuminated through a p-type semiconductor having total polarization $\overline{P}1$ and a positive initial interface charge density $\sigma_{init}$. However, in this case a larger band gap semiconductor window layer having smaller total polarization $\overline{P}2$ is employed to provide negative polarization charge sufficient to cancel the positive $\sigma_{init}$. It is possible that the magnitude of $\overline{P}2$ is greater than $\overline{P}1$, but the crystal polarity is such that $\overline{P}2$ is less than, $\overline{P}1$. Note that if the illumination layer of the photodetector is not made of a polar material, the polarization vector $\overline{P}1$ would be zero. Consequently, the polar window polarization vector $\overline{P}2$ would have to be negative.

BRIEF DESCRIPTION OF THE DRAWINGS

FIG. 2A is a band diagram for the illumination layer of a photodetector employing a n-type semiconductor illumination layer having a net negative interface charge $\sigma_{init}$ which is comprised of the charge in surface states, $\sigma_{surface}$, plus the polarization charge, $\sigma_{pol}$, which may have both spontaneous ($\sigma_{sp}$) and piezoelectric ($\sigma_{pz}$) components ($\sigma_{pol}=\sigma_{sp}+\sigma_{pz}$) in polar semiconductor materials. The interface charge results in a depletion region with width W and band bending that traps minority carriers (holes) photogenerated near the interface.

FIG. 2B is a band diagram for the illumination layer of a photodetector employing a p-type semiconductor illumination layer having a net positive interface charge $\sigma_{init}$ which is comprised of the charge in surface states, $\sigma_{surface}$, plus the polarization charge, $\sigma_{pol}$, which may have both spontaneous ($\sigma_{sp}$) and piezoelectric ($\sigma_{pz}$) components ($\sigma_{pol}=\sigma_{sp}+\sigma_{pz}$) in polar semiconductor materials. The interface charge results in a depletion region with width W and band bending that traps minority, carriers (electrons) photogenerated near the interface.

FIG. 3B is a band diagram of a preferred embodiment comprising a polar "window" on a p-type semiconductor illumination layer The polar window layer has total polarization $\overline{P2}$ that is sufficiently less than that of the semiconductor layer $\overline{P1}$ such that the negative induced polarization charge cancels the positive $\sigma_{init}$.

FIG. 4 illustrates a preferred embodiment PW-SIC APD using a III-Nitride polar window.

FIG. 5 illustrates the preferred embodiment structure for fabricated AlN PW-SiC APD.

DETAILED DESCRIPTION OF THE PREFERRED EMBODIMENTS

Figure 1:
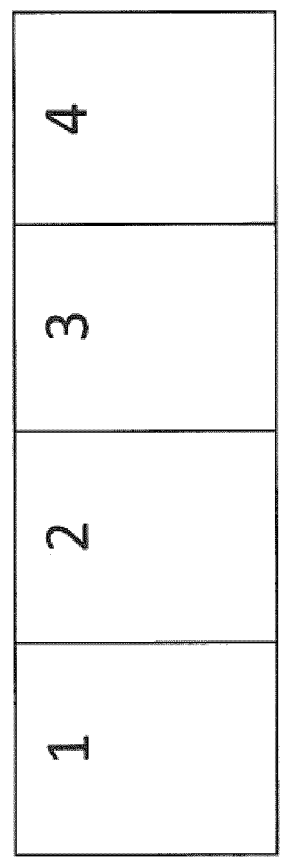
FIG. 1 is a schematic illustration of a preferred embodiment photodetector.

The embodiments of the invention and the various features and advantageous details thereof are explained more fully with reference to the non-limiting embodiments that are illustrated in the accompanying drawings and detailed in the following description. It should be noted that the features illustrated in the drawings are not drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used, herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various ranges, elements, components, regions, layers and/or sections, these elements, components, regions, layers and/or sections should not be limited by these terms. For example, when referring first and second ranges, these terms are only used to distinguish one range from another range. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An adverse effect is created by surface/interface charge $\sigma_{init}$ in the semiconductor layer within a photodetector structure that reduces the quantum efficiency of the photodetector at short wavelengths. In the case of a photodetector structure that is illuminated through a n-type semiconductor having $\sigma_{surface}$ and total polarization $\overline{P1}$ as shown in FIG. 2A, this surface charge is balanced by a positive space charge and a resulting barrier for holes, $\phi_{bi}$, given by:

$$\phi_{bi} = \phi_{Bn} - \phi_n$$

where $qV_n$ is the difference between the Fermi level and the conduction band in the bulk semiconductor, and $\phi_{bn}$ is the difference between the Fermi level and the conduction band at the semiconductor surface. The potential barrier $\phi_{bi}$ is deleterious to photodetector performance at short wavelengths, since the absorption coefficient in a semiconductor generally increases with increasing illumination energy above the band gap resulting in the generation of carriers closer to the surface. Photogenerated holes then can be trapped at the surface due to the potential barrier $\phi_{bi}$ and recombine through trap states rather than diffusing into the depletion region of the photodetector and Being collected and transformed into output current. While the above discussion focuses on the case of an n-type semiconductor, these arguments also apply to a p-type semiconductor, as shown in FIG. 2B, except that surface/interface charge density $\sigma_{init}$ is now positive, the space charge is negative and the potential barrier now exists for photogenerated electrons at the surface.

A preferred embodiment of the present invention combines a photodetector structure (or subassembly) and an appropriate semiconductor "window" region (or layer) deposited adjacent to the illuminated surface of the photodetector structure. Preferably, the "window" layer or region may be deposited by a process such as molecular beam epitaxy or metal organic chemical vapor deposition. The "window" region or layer may comprise a substantially transparent interface charge control layer, in the sense that it has both a larger band gap than the absorption region of the photodetector and a different total polarization (both spontaneous and/or piezoelectric) than the adjacent illuminated surface of the photodetector subassembly (as shown in FIG. 1). FIG. 1 illustrates a preferred embodiment comprising a doped semiconductor layer suitable for making an electrical contact 1, a photodetector 2 with the first semiconductor layer closest to illumination having polarization $\overline{P1}$ (or could be non-polar in which case $\overline{P1}=0$), a semiconductor polar window region 3 having total polarization $\overline{P2} \ne \overline{P1}$, and a doped semiconductor layer suitable for making an electrical contact 4. In the alternative, one or two metal contacts could be substituted for either or both of the doped semiconductor layers 1 and 4. It is rioted that one of ordinary skill in the art would appreciate that photodetectors have a variety of electrical contacts and that electrical connection is an inherent feature in photodetectors.

This preferred embodiment has the significant advantage that the discontinuity in polarization at the hetero-interface induces a polarization charge $\sigma_{pol}$ that offsets the surface/interface charge density $\sigma_{init}$ in the photodetector thereby suppressing the depletion region near the interface of the illuminated photodetector layer and polar window, and increasing the quantum efficiency of the detector at short wavelengths.

FIG. 2A is a band diagram for the illumination layer of a photodetector employ type semiconductor illumination layer having a negative interface charge $\sigma_{init}$ which is comprised of the charge in surface states, $\sigma_{surface}$, plus the polarization charge, $\sigma_{pol}$, which may have both spontaneous ($\sigma_{sp}$) and piezoelectric ($\sigma_{pz}$) components ($\sigma_{pol} = \sigma_{sp} + \sigma_{pz}$) in polar semiconductor materials. The interface charge results in a depletion region with width W and band bending/that traps minority carriers (holes) photogenerated near the interface.

FIG. 2B is a band diagram for the illumination layer of a photodetector employing a p-type semiconductor illumination layer having a net positive interface charge $\sigma_{init}$ which is comprised of the charge in surface states, $\sigma_{surface}$, plus the polarization charge, $\sigma_{pol}$, which may have both spontaneous ($\sigma_{sp}$) and piezoelectric ($\sigma_{pz}$) components ($\sigma_{pol} = \sigma_{sp} + \sigma_{pz}$) in polar semiconductor materials. The interface charge results in a depletion region with width W and band bending that traps minority carriers (electrons) photogenerated near the interface.

Figure 3A:
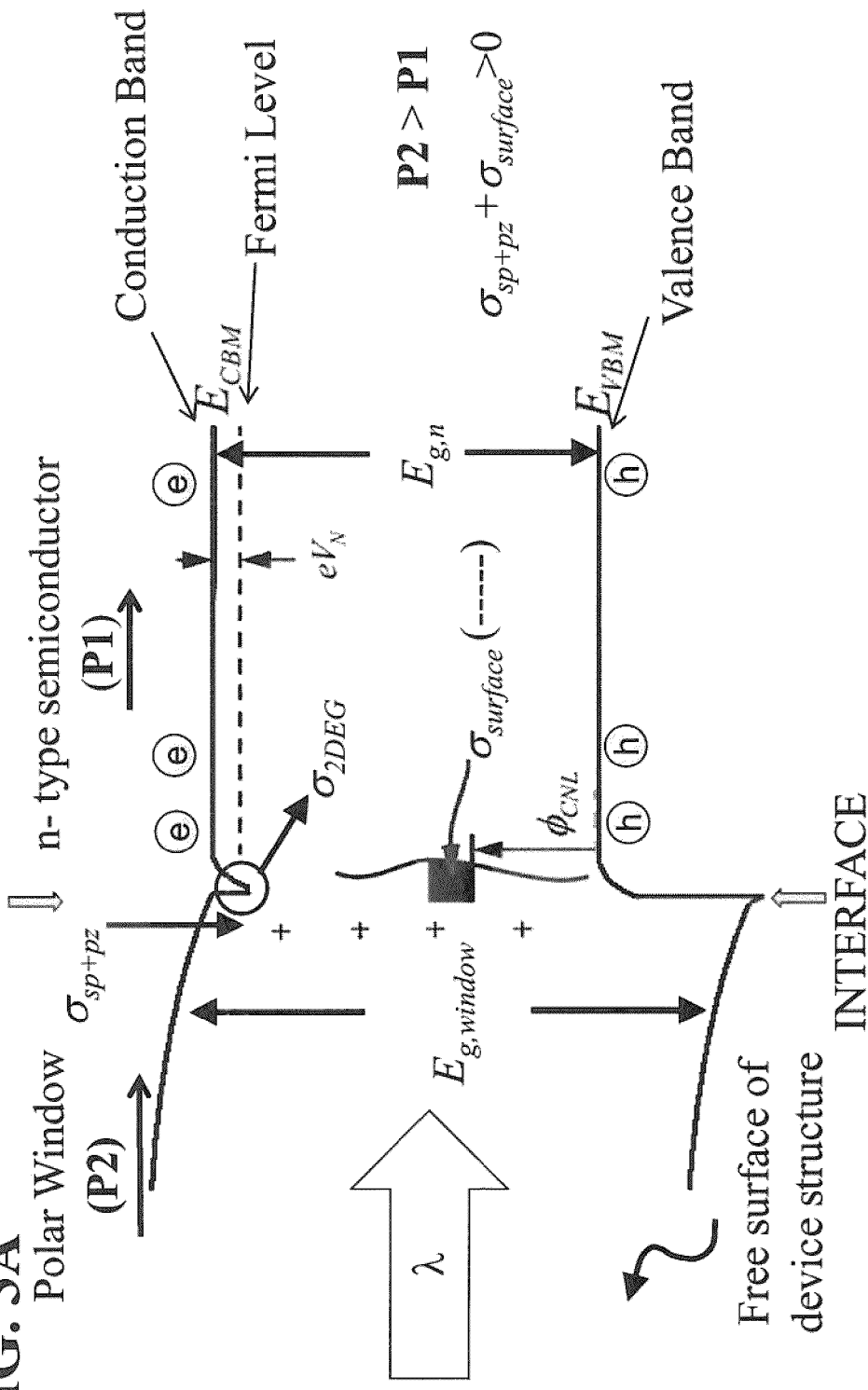
FIG. 3A is a band diagram of a preferred embodiment comprising a polar "window" on a. n-type semiconductor illumination layer. The polar window layer has total polarization $\overline{P2}$ that is sufficiently greater than that of the semiconductor layer $\overline{P1}$ such that the positive induced polarization charge cancels the negative $\sigma_{init}$.

FIG. 3A is a band diagram of a preferred embodiment comprising a polar "window" on a n-type semiconductor illumination layer. The polar window layer has total polarization $\overline{P2}$ that is sufficiently greater than that of the semiconductor layer $\overline{P1}$ such that the positive induced polarization charge cancels the negative $\sigma_{init}$.

FIG. 3B is a band diagram of a preferred embodiment comprising a polar "window" on a p-type semiconductor illumination layer. The polar window layer has total, polarization $\overline{P2}$ that is sufficiently less than that of the semiconductor layer $\overline{P1}$ such that the negative induced polarization charge cancels the positive $\sigma_{init}$.

Shown in FIG. 2A is an energy band diagram for a conventional photodetector assembly employing and illuminated first through a n-type semiconductor layer that has a polarization $\overline{P1}$, as well as a mid-gap surface state density that results in a net negative initial surface/interface charge density $\sigma_{init}$, a barrier for hole transport at the surface of $\phi_{bi}$, and a surface depletion width W.

As used herein, the term "light" means electromagnetic radiation, unless specifically pointed out to the contrary. Charge neutrality "pins" the Fermi level at the semiconductor surface near the mid-gap resulting in a net negative surface interface charge and an offsetting positive space charge from ionized donors. Since light is more strongly absorbed at the surface of a semiconductor, as the difference between the energy of the light and the band gap of the semiconductor increases, photogenerated holes in this case move to the surface and undergo surface recombination through the surface trap states, resulting in reduced detector quantum efficiency.

In accordance with the principles of the present invention, in a preferred embodiment a photodetector illuminated through a n-type semiconductor layer having total polarization $\overline{P1}$ and a net negative initial surface/interface charge density $\sigma_{init}$, a larger band gap semiconductor window layer having a larger total polarization $\overline{P2}$ than the n-type semiconductor is placed (or located) adjacent to the photodetector subassembly, whereby a positive polarization interface charge $\sigma_{pol}$ is formed (at interface between the polar window and detector subassembly as shown in FIG. 3A). Specifically, shown in FIG. 3A, the polarization vector quantity $\overline{P}2$ of the polar window is greater that the polarization vector quantity $\overline{P}1$ of the n-type semiconductor layer (i.e., $\overline{P}2>\overline{P}1$) such that the positive induced polarization charge $\sigma_{pol}=\sigma_{sp+pz}$ cancels the initial net negative surface/interface; charge $\sigma_{init}$ associated with the density of surface states in the n-type semiconductor layer. As used herein the term $\overline{P}$ and/or $P$ in bold face represents a polarization vector quantity having both magnitude and direction. Using the principles of the present invention, this charge, can be sufficient to cancel the negative $\sigma_{init}$ and eliminate the depletion region in the n-type semiconductor. (FIG. 3A; layer 4 in FIG. 4) near the interface of the illuminated photodetector layer and the polar window. As a result, holes generated by short wavelength photons are repelled from rather than attracted to the surface of the n-type semiconductor and these holes are able to diffuse to the depletion region of the photodetector, where they are collected and the high photon energy quantum efficiency of the photodetector is increased. An analogous case occurs for a photodetector illuminated through a p-type semiconductor having total polarization $\overline{P}1$ and a net initial positive interface charge density $\sigma_{init}$, as shown in FIG. 2B. However, in this case a larger band gap semiconductor window layer having smaller total polarization $\overline{P}2$ is employed to provide negative polarization charge $\sigma_{pol}=\sigma_{sp+pz}$ sufficient to cancel the positive $\sigma_{init}$ (FIG. 3B).

The polar semiconductor "window" layer 5 may be formed of wurtzite InN, GaN, AlN, or alloys thereof, or ZnO, MgO, ZnS, ZnSe, ZnTe, or alloys thereof, or SiC.

The polar semiconductor "window" layer 5 could also be a strained layer of zincblende GaAs, InAs, AlAs, GaN, InN, AlN, GaSb, AlSb, InSb or alloys thereof, ZnO, MgO, ZnS, ZnSe, ZnTe, and alloys thereof, or SiC, with a different lattice constant than the first photodetector layer 4 such that a polarization charge forms at the interface of the window layer 5 and the first photodetector layer 4.

Note that whatever choice is made for the material forming the polar window 5, it is preferred that the first illuminated layer 4 of the photodetector have a smaller band gap for both p and n-type materials, although the polar window may have a smaller bandgap if its bandgap is indirect and absorption is minimal.

In another preferred embodiment, the thickness (t) of the semiconductor "window" layer is designed to additionally serve as a quarter wave anti-reflection coating at a desired wavelength and is given by:

$$t=\lambda_0/4n_0$$

where $\lambda_0$ is the desired illumination wavelength and $n_0$ is index of refraction of the semiconductor window layer at the wavelength $\lambda_0$.

FIG. 4 illustrates, a preferred embodiment photodetector comprising a SiC APD as the photodetector structure (or subassembly) and a wider hand gap III-Nitride semiconductor as the polar window layer 5. This is distinctly different from putting solely an antireflective coating. Antireflective coatings are generally not polar material and do not induce a polarization charge at the interface. Technologically, this is significant, as the spectral response of current SiC APDs peaks at ~266 nm (because indirect bandgap material) and then degrades at increasingly shorter wavelengths due to reduced absorption depth and the presence of surface states in this material that lie in the mid-gap ~0.2-0.6 eV below the conduction band, resulting in a negative surface interface charge density. That is, because the semiconductor is a periodic crystal lattice, the surface is essentially a defect in this periodicity which introduces, "surface states" which serve to pin the Fermi level in the middle of the gap, causing a surface depletion region and surface band bending that prevents holes generated near the surface by high energy photons from diffusing into the detector depletion region, thereby reducing the quantum efficiency at low wavelengths. In conventional devices, in the absence of the polar "window," the deep ultraviolet sensitivity of these devices may be enhanced by reducing the thickness of the illuminated contact layer to promote photogenerated carrier collection in the junction region of the absorption/multiplication region as has been done with UV-enhanced Silicon avalanche photodiodes, but the quantum efficiency of these devices still suffers from the surface recombination through interface states. Even though the layer is made thinner, the interface states remain and still result in surface recombination. A group III polar (0001) wurtzite(Al)(In)GaN semiconductor window layer deposited upon a p-down SiC APD structure will induce a positive polarization charge at the interface between the n-SiC (layer 4 in FIG. 4) and the (Al)(In)GaN polar window (layer 5 in FIG. 4) due to its large spontaneous polarization that can offset the negative surface interface charge at this hetero-interface. With the n-type case, by placing a material which has a larger, polarization on the surface being illuminated, we can cancel or substantially eliminate the negative surface charge, which causes band bending (see left of FIG. 2A), by providing positive charge at the interface to cancel the initial negative surface/interface charge $\sigma_{init}$ and substantially eliminating the surface barrier. Photogenerated carriers (holes in the n-type case) that are generated at shorter wavelength near the interface can diffuse toward the detector depletion region and be collected with greater efficiency because these carriers will no longer encounter the barrier near the interface. In the p-type case, it would be electrons that would be encounter the potential barrier near the surface/interface.

Figure 7:
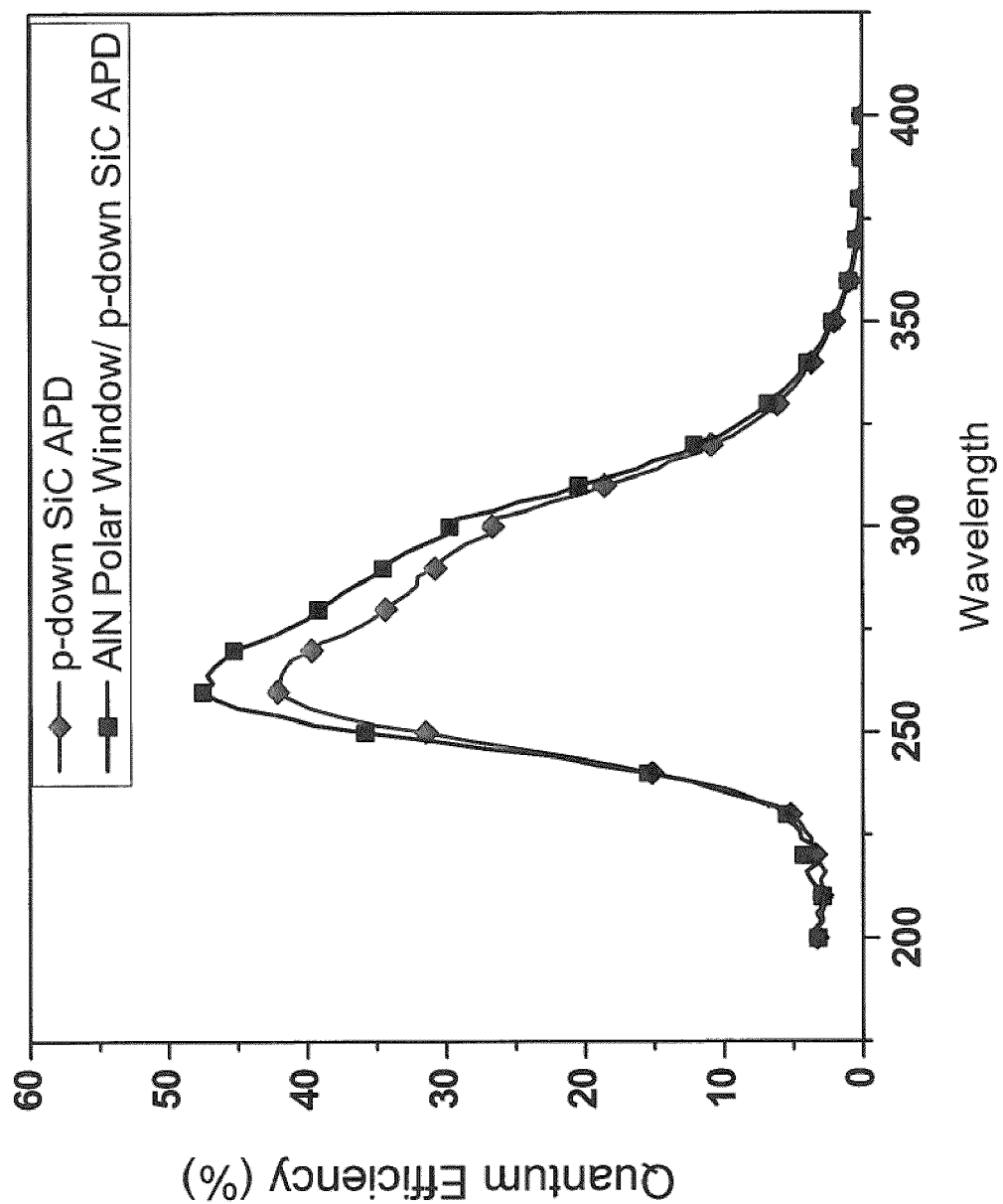
FIG. 7 is a graphical illustration depicting the spectral responses of an AlN-PW SiC APD and conventional SiC APD.

As shown in FIG. 7, experiments conducted resulted in enhancement in quantum efficiency of approaching approximately ten percent throughput the spectral range.

The effectiveness of a preferred embodiment has been experimentally demonstrated by examining the spectral response of p-side down SiC avalanche photodiodes (APD) employing an AlN polar, window. FIG. 5 illustrates a preferred embodiment APD structure comprising a 0.48 μm thick absorption/multiplication region 3 grown on a 2 μm thick p$^+$-SiC layer 2 and capped by a 0.10 μm thick n$^+$-SiC layer 4 and then a 10 nm thick AlN polar window 5.

Figure 6:
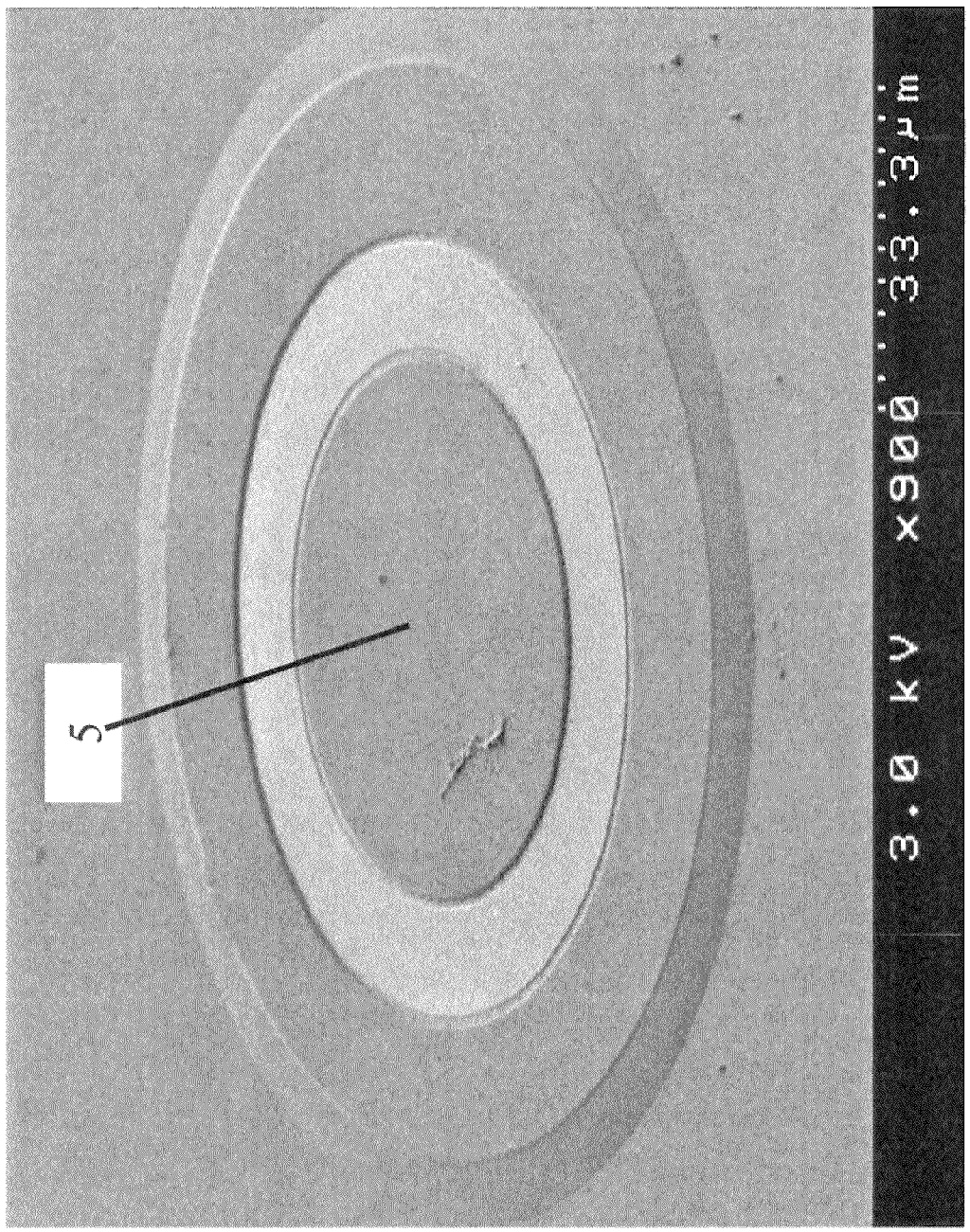
FIG. 6 is a Scanning Electron Microscopy image of a fabricated AlN PW-SiC APD having a central polar window surrounded by the contact to the polar window, magnified 900 times. The scale shows 33.3 microns from the first dot to the last dot.

FIG. 6 is a Scanning Electron Microscopy image of a fabricated AlN PW-SiC APD having a central polar window surrounded by the contact, to the polar window magnified 900 times The scale shows 33.3 microns from the first dot to the last dot.

The AlN-PW SiC APD (FIG. 7 square curve) exhibits, a peak quantum efficiency of ~47% at 266 nm that is ~10% larger than what is observed for a SiC APD without the AlN polar window (FIG. 7 diamond curve). This 10% enhancement is seen nearly throughout the spectral range, and is attributed at high energy to a compensation of surface/interface charge. However, this enhancement is likely also partially due to increased collection of light associated with reduced reflection losses on the surface of the detector.

Figure 8:
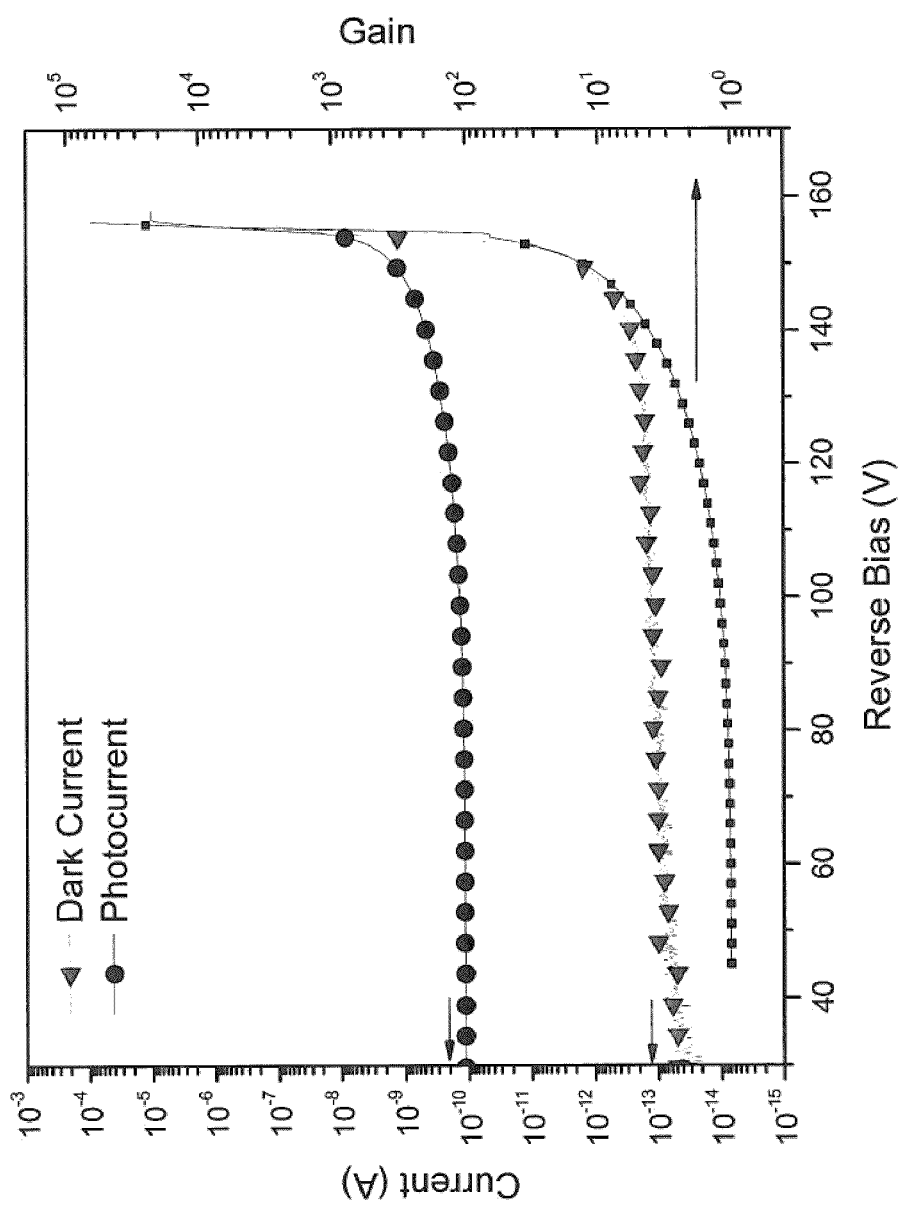
FIG. 8 illustrates current/voltage characteristics and Gain from a fabricated AlN-PW SiC APD.

These devices can have dark currents as low as 1 nA at a gain of 100 that is similar to what is observed for the SiC APDs without the AlN polar window. This indicates that the dark current in these AlN PW SiC APDs is not adversely effected by potential defects at the hetero-interface and is likely related to defects in the underlying SiC substrate and/or the device fabrication process (FIG. 8). These devices exhibit reverse breakdown at ~157 V that is attributed to avalanche breakdown within the SiC pn junction and corresponds to the value of the critical breakdown field for the 4H-SiC multiplication region. These devices have peak gain as high as ~$10^5$ near avalanche breakdown (FIG. 8 black square curve pointing to the right dependent axis).

Figure 9:
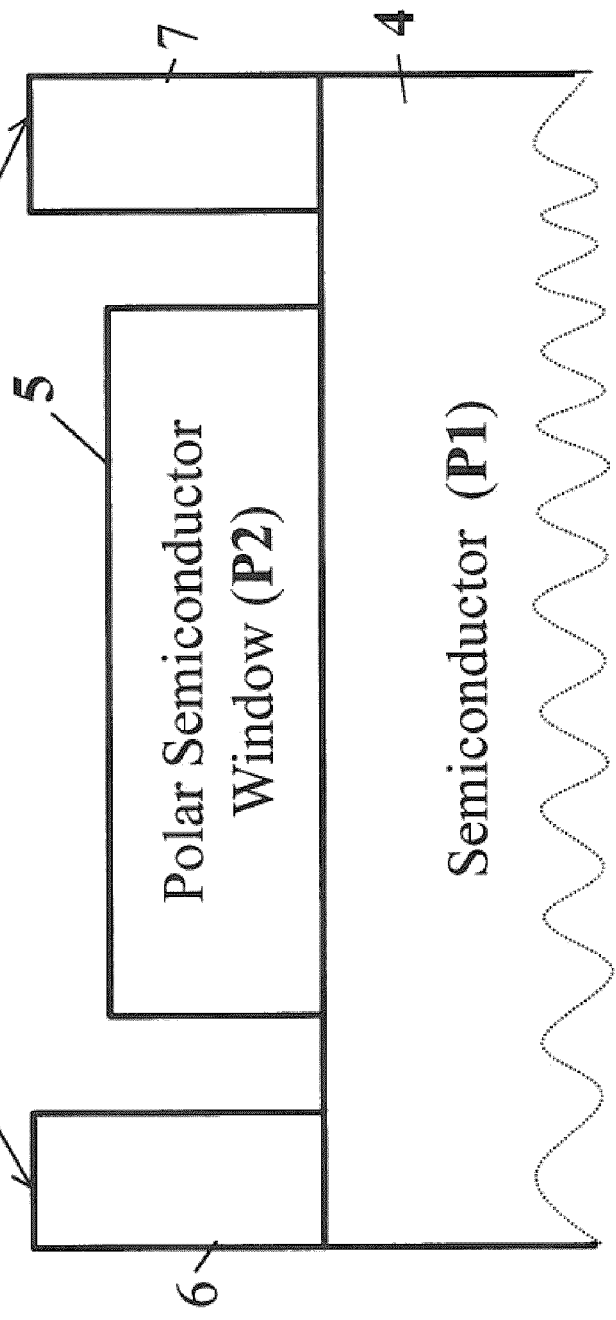
FIG. 9 illustrates schematically a photoconductive detector structure employing a polar semiconductor window having polarization $\overline{P2}$ adjacent a semiconductor absorption region having polarization $\overline{P1}$. If it is an N-type semiconductor, $\overline{P2}>\overline{P1}$. If P-type, $\overline{P2}<\overline{P1}$.

FIG. 9 illustrates schematically a preferred embodiment photoconductive detector structure employing a polar semiconductor window having polarization $\overline{P}2$ adjacent a semiconductor absorption region having polarization $\overline{P}1$. If it is an N-type semiconductor, $\overline{P}2 > \overline{P}1$. If P-type, $\overline{P}2 \leq \overline{P}1$.

Figure 10:
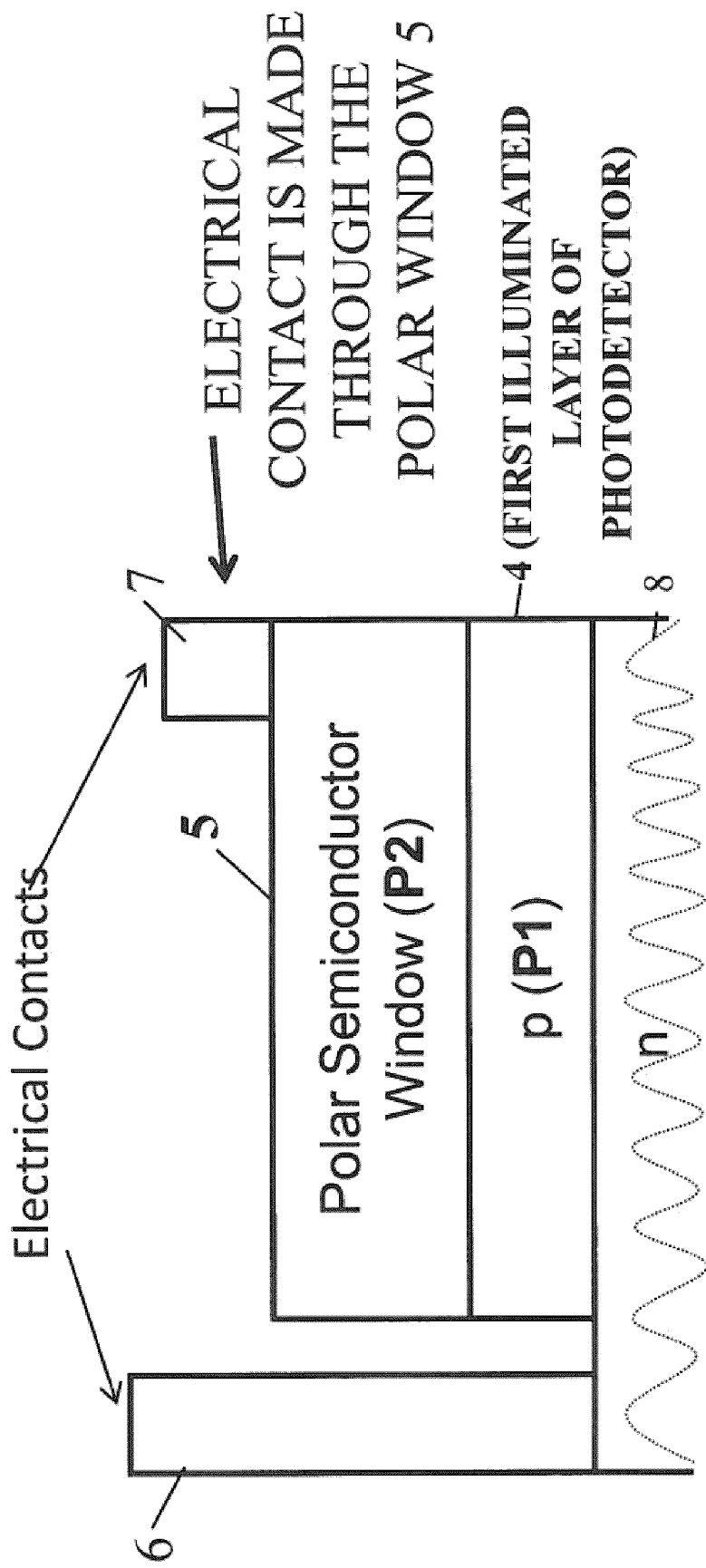
FIG. 10 illustrates schematically a lateral contact p-(i)-n junction photodiode structure employing a polar semiconductor window having polarization $\overline{P2}$ adjacent a P-type semiconductor layer of arbitrary doping having polarization $\overline{P1}$ (where $\overline{P2}<\overline{P1}$). At least one of the electrical contacts (6,7) to the diode is made through the polar semiconductor window.
Figure 11:
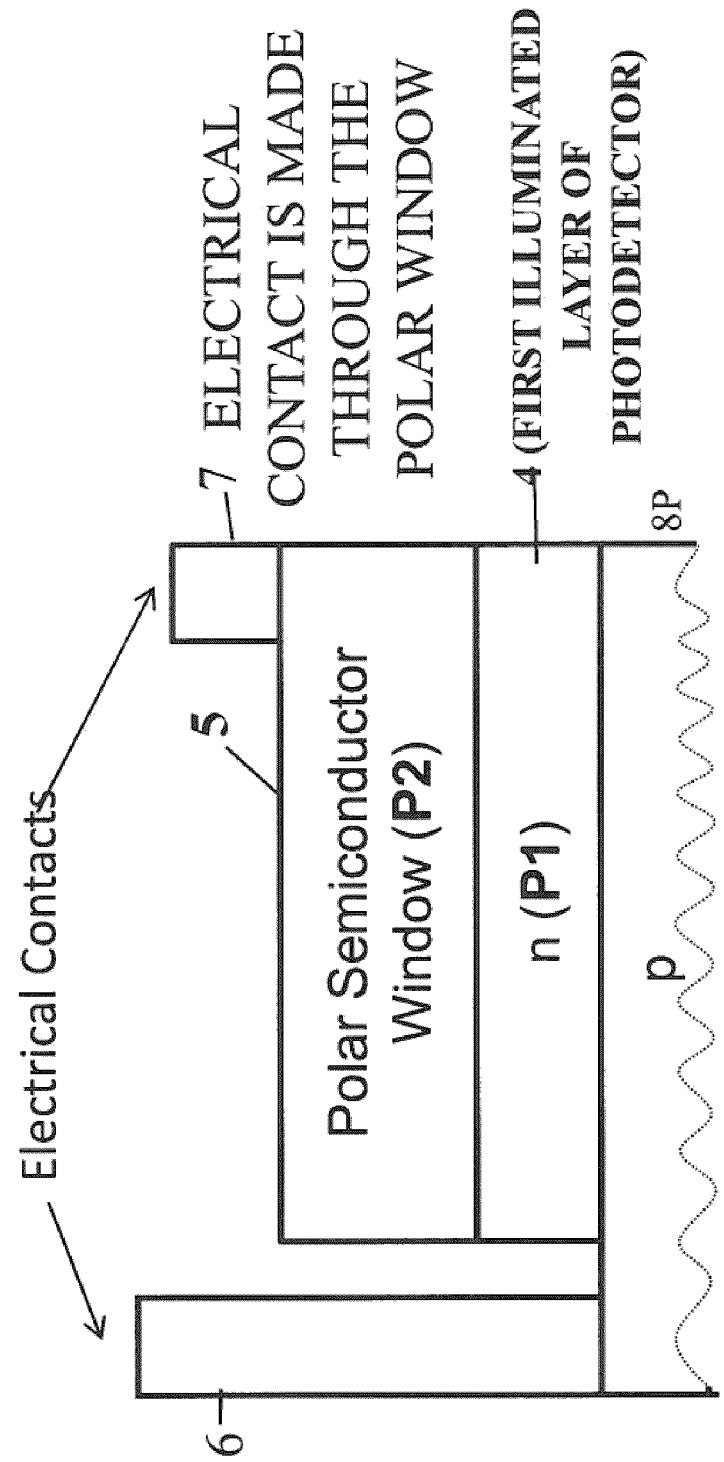
FIG. 11 illustrates schematically a lateral contact p-(i)-n junction photodiode structure employing a polar semiconductor window having polarization $\overline{P2}$ adjacent an n-type semiconductor layer of arbitrary doping having polarization $\overline{P1}$ (where, $\overline{P2}>\overline{P1}$). At least one of the electrical contacts (6,7) to the diode is made through the polar semiconductor window.

FIGS. 10-13 illustrate lateral contact photodiodes. FIGS. 10 and 11 are lateral contact photodiodes where at least one electrical contact is made through the polar semiconductor window. FIG. 10 illustrates schematically a preferred embodiment lateral contact p-(i)-n junction photodiode structure employing a polar semiconductor window having polarization $\overline{P}2$ adjacent a P-type semiconductor layer of arbitrary doping having polarization $\overline{P}1$. At least one electrical contact (or electrode) to the diode is made through the polar semiconductor window $\overline{P}2 < \overline{P}1$.

FIG. 11 illustrates schematically a preferred embodiment lateral contact p-(i)-n junction photodiode structure employing a polar semiconductor window having polarization $\overline{P}2$ adjacent an n-type semiconductor layer of arbitrary doping having polarization $\overline{P}1$ The polarization $\overline{P}2$ is greater than $\overline{P}1$ ($\overline{P}2 > \overline{P}1$). At least one electrical contact (or electrode) to the diode is made through the polar semiconductor window.

Figure 12:
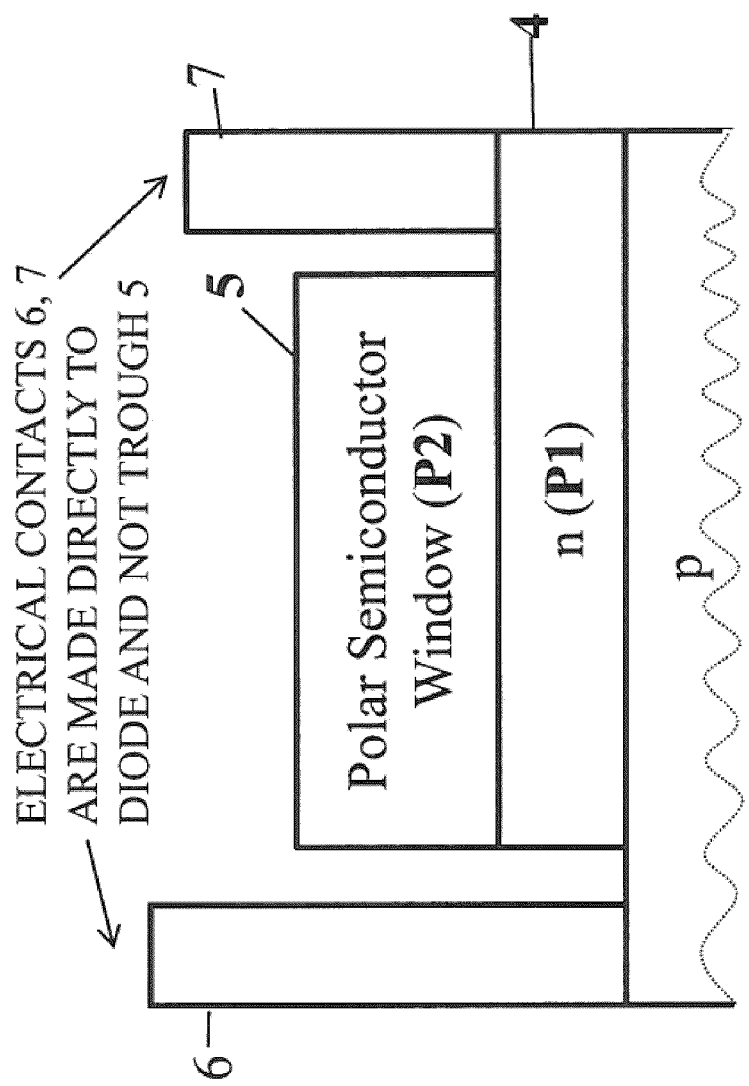
FIG. 12 illustrates schematically a lateral contact p-(i)-n junction photodiode structure employing a polar semiconductor window having polarization $\overline{P2}$ adjacent an n-type semiconductor layer of arbitrary doping having polarization $\overline{P1}$ (where $\overline{P2}>\overline{P1}$). Both contacts 6, 7 are made to the diode without using polar semiconductor window.
Figure 13:
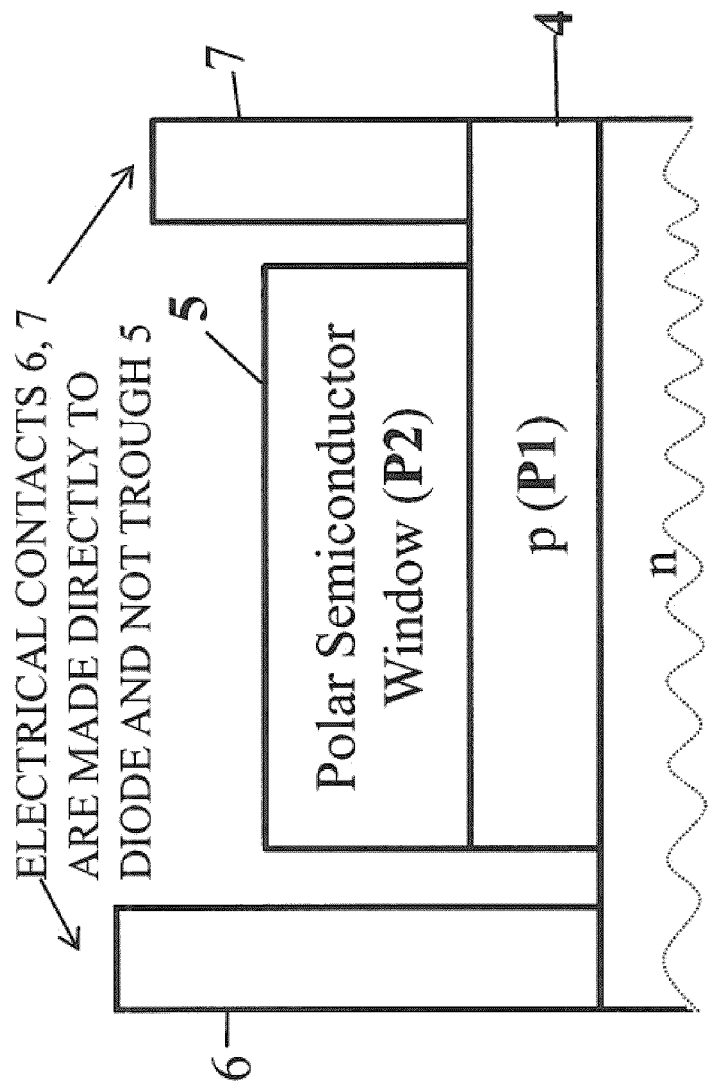
FIG. 13 illustrates schematically a lateral contact p-(i)-n junction photodiode structure employing a polar semiconductor window having polarization $\overline{P2}$ adjacent a p-type semiconductor layer of arbitrary doping having polarization $\overline{P1}$ (where $\overline{P2}<\overline{P1}$). Both electrical contacts 6, 7 are made to the diode without using polar semiconductor window.

FIGS. 12 and 13 are lateral photodiode structures where the electrical contacts (or electrodes) are made directly to either the n-layer (FIG. 12) or p-layer (FIG. 13) of the photodiode. FIG. 12 illustrates schematically a preferred embodiment lateral contact p-(i)-n junction photodiode structure employing a polar semiconductor window having polarization $\overline{P}2$ adjacent an n-type semiconductor layer of arbitrary doping having polarization $\overline{P}1$. The polarization $\overline{P}2$ is greater than $\overline{P}1$ ($\overline{P}2 > \overline{P}1$). Both electrical contacts (or electrodes) 6, 7 are made to the diode without using polar semiconductor window.

FIG. 13 illustrates schematically a preferred embodiment lateral contact p-(i)-n junction photodiode structure employing a polar semiconductor window having polarization $\overline{P}2$ adjacent a p-type semiconductor layer of arbitrary doping having polarization $\overline{P}1$. Both electrical contacts (or electrodes) 6,7 are made to the diode without using polar semiconductor window. The polarization $\overline{P}2$ is less than $\overline{P}1$ ($\overline{P}2 < \overline{P}1$).

Figure 14:
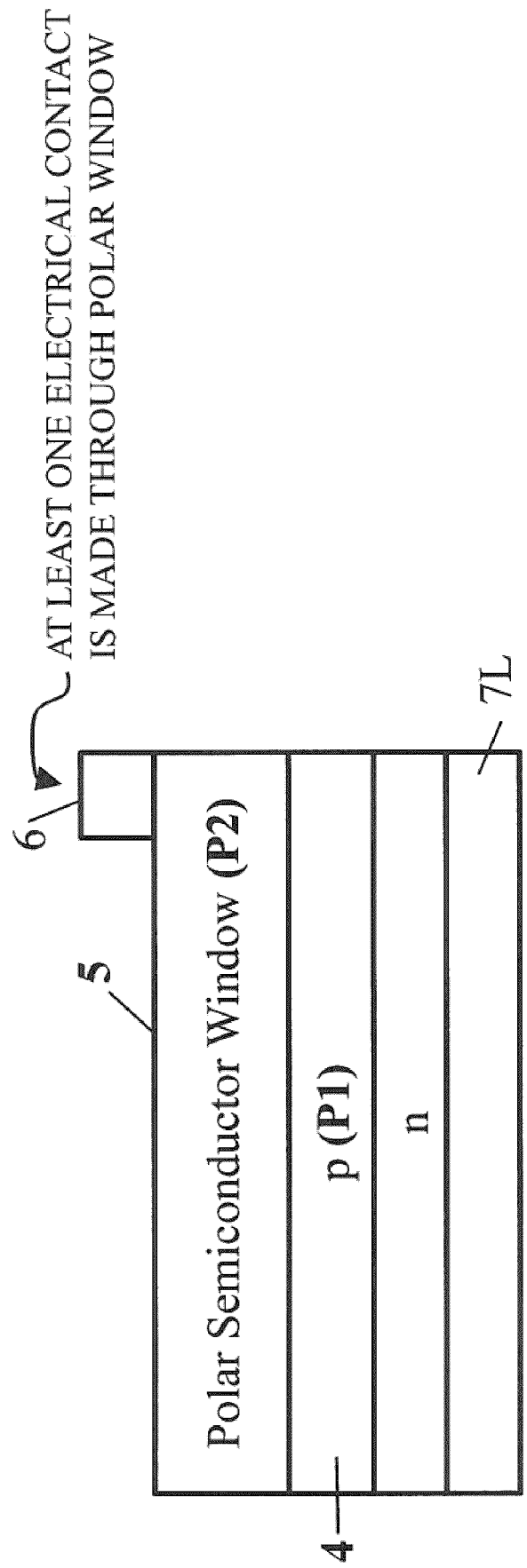
FIG. 14 illustrates schematically a vertical contact p-(i)-n junction photodiode structure employing a polar semiconductor window having polarization $\overline{P2}$ adjacent a P-type semiconductor layer of arbitrary doping having polarization $\overline{P1}$ (where $\overline{P2}<\overline{P1}$). At least one of the electrical contacts (6,7) to the diode is made through the polar-semiconductor window.
Figure 15:
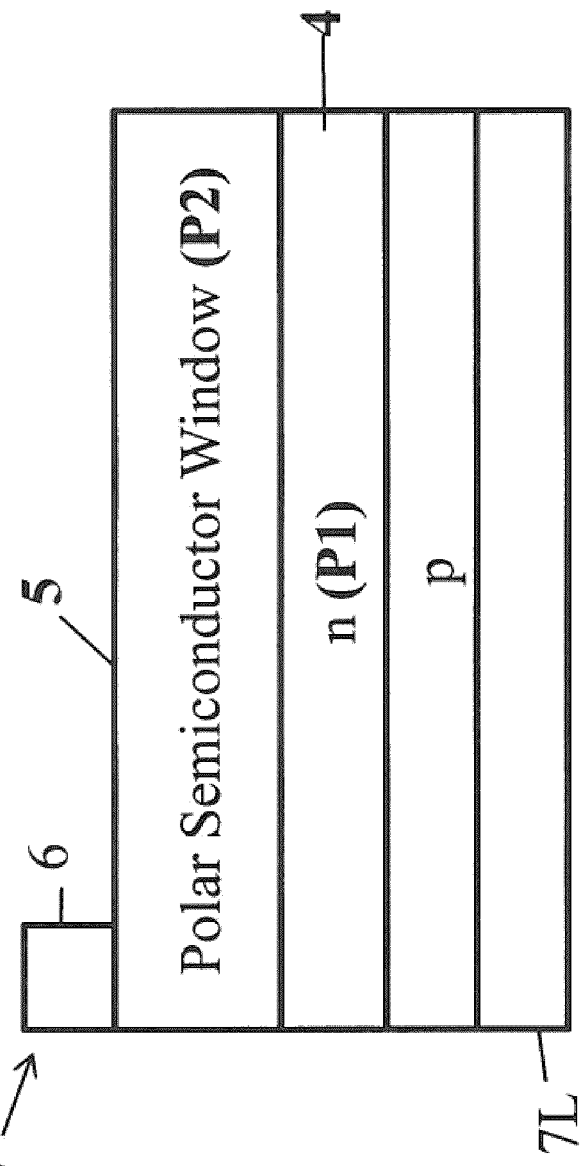
FIG. 15 illustrates schematically a vertical contact p-(i)-n junction photodiode structure employing a polar semiconductor window having polarization $\overline{P2}$ adjacent an n-type semiconductor layer of arbitrary doping having polarization $\overline{P1}$ (where $\overline{P2}>\overline{P1}$). At least one of the electrical contacts (6,7)to the diode is made through the polar semiconductor window.

FIGS. 14 and 15 are both vertical contact photodiodes where at least one contact is made through the polar semiconductor window. FIG. 14 illustrates schematically a preferred embodiment vertical contact p-(i)-n junction photodiode structure employing a polar semiconductor window having polarization $\overline{P}2$ adjacent a P-type semiconductor layer of arbitrary doping having polarization $\overline{P}1$. At least one electrical contact (or electrode) to the diode is made through the/ polar semiconductor window. The polarization $\overline{P}2$ is less than $\overline{P}1$ ($\overline{P}2 < \overline{P}1$). Note that the one contact is made through a doped semiconductor layer 7L suitable for making an electrical contact.

Figure 16:
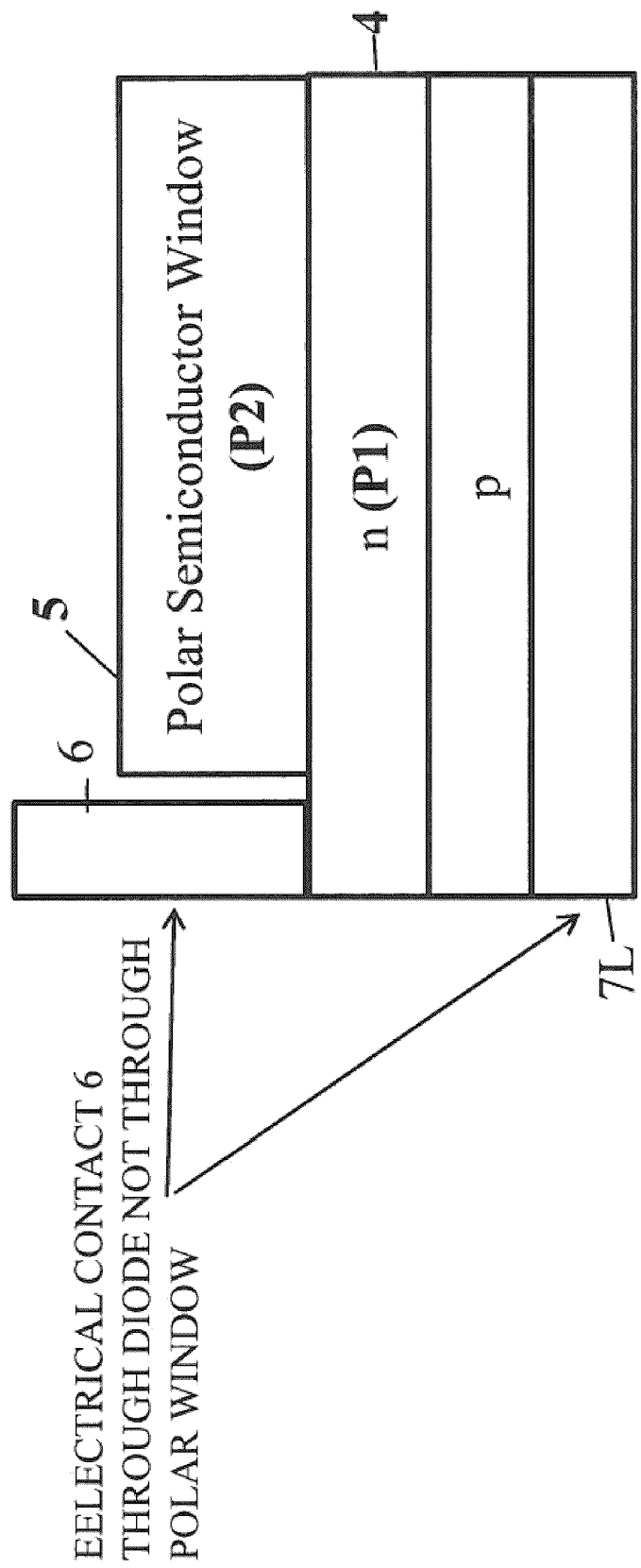
FIG. 16 illustrates schematically a vertical contact p-(i)-n junction photodiode structure employing a polar semiconductor window having polarization $\overline{P2}$ adjacent an n-type, semiconductor layer of arbitrary doping having polarization $\overline{P1}$ (where $\overline{P2}>\overline{P1}$). Both electrical contacts 6,7 are made to the diode without using polar semi conductor window.
Figure 17:
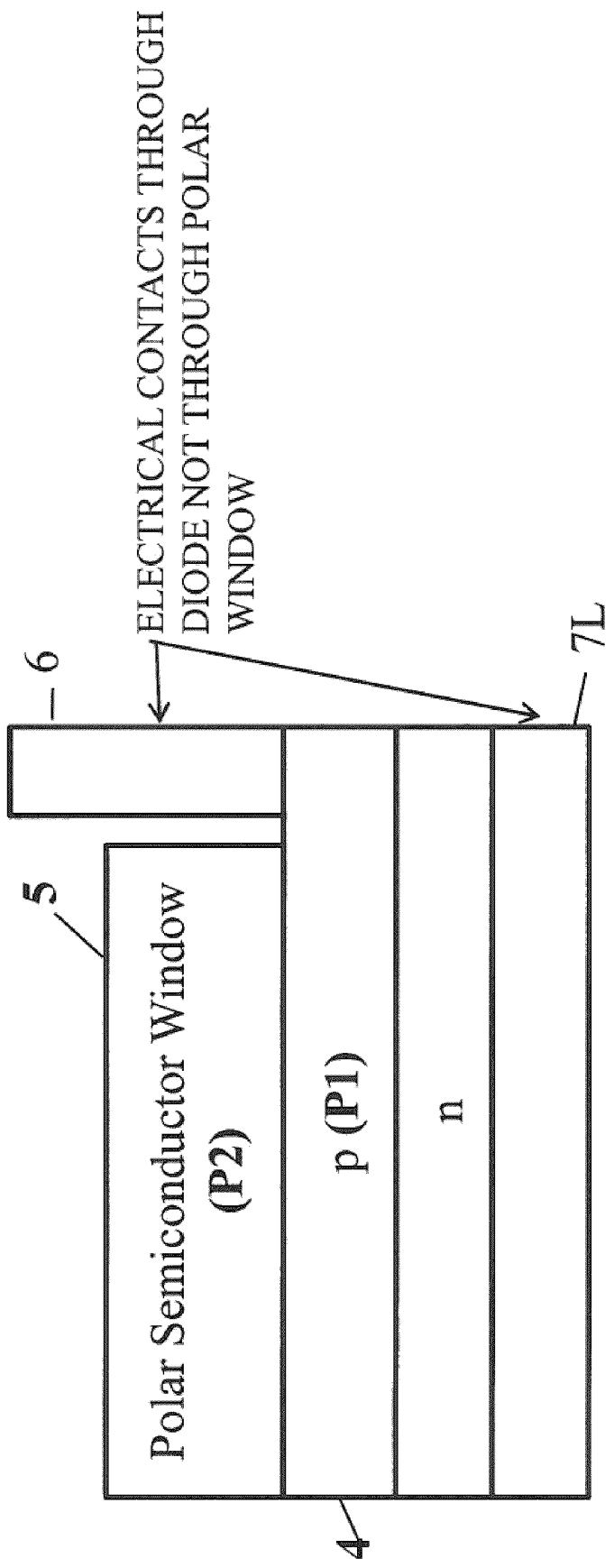
FIG. 17 illustrates schematically a vertical contact p-(i)-n junction photodiode structure employing a polar semiconductor window having polarization $\overline{P2}$ adjacent a P-type semiconductor layer of arbitrary doping having polarization $\overline{P1}$ (where $\overline{P2}<\overline{P1}$). Both electrical contacts 6,7 are made to the diode without using polar semiconductor window.

FIG. 15 illustrates schematically a vertical contact p-(i)-n junction photodiode structure employing a polar semiconductor window having polarization $\overline{P}2$ adjacent an n-type semiconductor layer of arbitrary doping having polarization $\overline{P}1$. At least one electrical contact (or electrode) to the diode is made through the polar semiconductor window. The polarization $\overline{P}2$ is greater than $\overline{P}1$ ($\overline{P}2 > \overline{P}1$). Note that one contact is made through a doped semiconductor layer 7L suitable for making an electrical contact. FIGS. 16 and 17 are vertical photodiodes and the electrical contacts are made directly without using the polar semiconductor window. FIG. 16 illustrates schematically a vertical contact p-(i)-n junction photodiode structure employing a polar semiconductor window having polarization $\overline{P}2$ adjacent an n-type semiconductor layer of arbitrary doping, having polarization $\overline{P}1$. Both electrical contacts (or electrodes) are made to the diode without using polar semiconductor window. The polarization $\overline{P}2$ is greater than $\overline{P}1$ ($\overline{P}2 > \overline{P}1$). Note that one contact is made through a doped semiconductor layer 7L suitable for making an electrical contact.

FIG. 17 illustrates schematically a vertical contact p-(i)-n junction photodiode structure employing a polar semiconductor window having polarization $\overline{P}2$ adjacent a P-type semiconductor layer of arbitrary doping having polarization Pi. The polarization $\overline{P}2$ is less than $\overline{P}1$ ($\overline{P}2 < \overline{P}1$). Both electrical contacts (or electrodes) are made to the diode without using polar semiconductor window. Note that one contact is made through a doped semiconductor layer 7L suitable for making an electrical contact.

Figure 18:
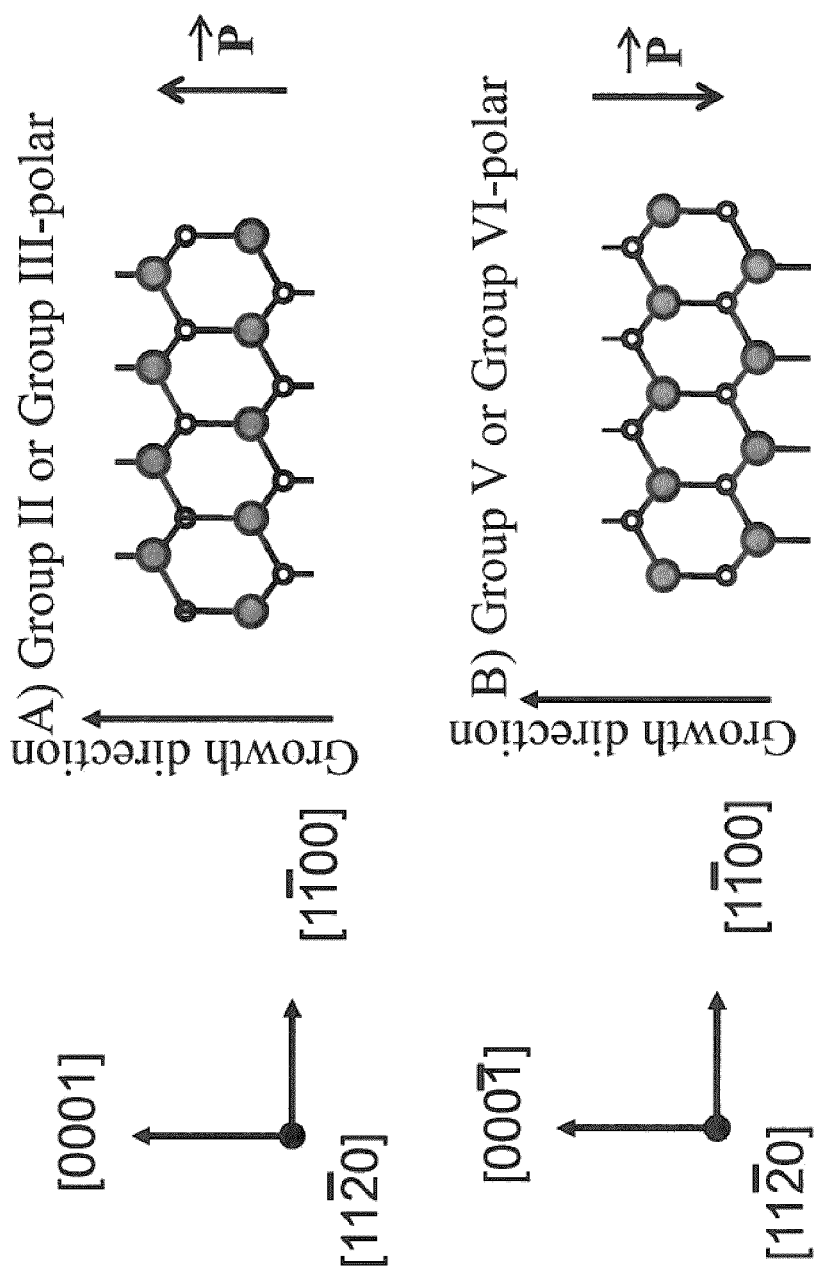
FIG. 18 illustrates the Wurtzite structure for III-V and II-VI polar semiconductor lattices.

FIG. 18 schematically illustrates the Wurtzite structure for III-V and II-VI polar semiconductor lattices. Group II polar or Group III polar occurs if in the growth direction the atoms are going from the Group II or Group III atom to the corresponding Group VI or Group V atom. Group VI polar of Group V polar occurs if in the growth direction the atoms are going from the Group VI or Group V atom to the corresponding Group II or Group III atom.

As used herein the terminology "window" or "polar semiconductor window" encompasses any layer or plurality of layers that has a total polarization that is different from that of the semiconductor upon which it is adjacent; and the magnitude and the direction of the polarization is such that a beneficial polarization interface charge is produced. The layer or layers would have to have a bandgap larger than the semiconductor upon which it is adjacent. However, the requirement for a larger bandgap may be relaxed without departing from the scope of the invention if the layer has an indirect bandgap because in this case the bandgap may then be smaller but absorption losses would be minimal.

The terminology Fermi level as used herein is the energy of electrons in a semiconductor. The probability of an electron residing at the Fermi level is fifty percent.

As used herein, the term "light" means electromagnetic radiation, unless specifically pointed out to the contrary. That is, the photodetectors illustrated in the figures herein may be used in conjunction with other forms of electromagnetic radiation and the terminology "light" encompasses other forms of electromagnetic radiation.

As used herein, the terminology "illumination layer" or "first illuminated layer" is the first layer having a first surface through which light first enters the semiconductor photodetector and the first layer in which photo generated carriers are generated.

As used herein, short absorption length means a distance comparable to the depletion width associated with band bending near the interface of the initial semiconductor layer with air.

As used herein the terminology conductivity is the degree to which a specified material conducts electricity, calculated as the ratio of the current density in the material to the electric field that causes the flow of current.

As used herein the terminology doping in the case of a semiconductor means intentionally introducing impurities into an extremely pure semiconductor to change its electrical properties. Further, as used herein, a semiconductor is considered doped if it intentionally or unintentionally contains impurities or defects that change its electrical properties.

The foregoing description of the specific embodiments reveal the general nature of the embodiments herein and the present invention is not limited to the embodiments disclosed. Applying current knowledge, modifications and/or adaptations of such specific embodiments are contemplated to be within the scope of the present invention, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A detection device comprising:
a photodetector comprising a first semiconductor layer through which light first enters the photodetector; the first semiconductor layer formed of a first semiconductor material crystal lattice which terminates at an interface; the discontinuity of the semiconductor crystal lattice at the interface creating a first interface charge; the first semiconductor layer being an absorption layer in which photons in a predetermined wavelength range are absorbed and create photogenerated carriers; and
a second polar semiconductor layer deposited on the crystal lattice of the first semiconductor layer, the second polar semiconductor being substantially transparent to light in the predetermined wavelength range, the second polar semiconductor layer having a total polarization different from the first semiconductor layer so that a second interface charge is induced at the interface between the first and second semiconductor layers; the induced second interface charge reduces or substantially cancels the first interface charge;
whereby the reduction or substantial cancellation of the surface charge in the first semiconductor layer increases the collection of photogenerated carriers by the photodetector.

2. The detection device of claim 1 wherein the first layer is made of a polar material.

3. The detection device of claim 1 wherein the first semiconductor layer is n-type and the second polar semiconductor layer has a total polarization that is substantially greater than the polarization of the first polar semiconductor layer such that the positive induced polarization charge cancels the negative interface charge.

4. The detection device of claim 1 wherein the first semiconductor layer is p-type and the second polar semiconductor layer has a total polarization that is substantially less than the polarization of the first polar semiconductor layer such that the negative induced polarization charge cancels the positive interface charge.

5. The detection device of claim 1 further comprising first and second electrical contacts or electrical contact layers.

6. The detection device of claim 1 wherein the second semiconductor layer is doped and an electrical contact is made to the second semiconductor layer.

7. The detection device of claim 1 wherein the second polar semiconductor layer has a wider band gap than the first semiconductor layer.

8. The detection device of claim 1 wherein the detection device operates to detect light within a predetermined wavelength range and the second polar semiconductor layer is formed of polar material that is substantially transparent to light within the predetermined wavelength range such that photo-generated carriers are not substantially created within the second polar semiconductor layer.

9. The detection device of claim 1 wherein the thickness of the second polar semiconductor layer is such that the photon flux entering the first semiconductor layer is maximized such that no additional antireflection layer is necessary.

10. The detection device of claim 1 wherein the first semiconductor layer is n-type and the interface terminates with negative first interface charge due to breakdown of periodicity of the crystal lattice creating states which are occupied by electrons thereby creating a negative first interface charge which diminishes collection of minority carriers photogenerated near the interface, and by placing a second polar semiconductor layer with a larger polarization at the interface of the first polar semiconductor, the first interface charge is cancelled or diminished thereby substantially eliminating the effect of the first interface charge on the collection of minority carriers photogenerated near the interface.

11. The detection device of claim 1 wherein the addition of the second polar semiconductor layer enables the collection of carriers photogenerated near the interface by higher energy photons to enhance short wavelength performance.

12. The detection device of claim 1 wherein the second polar semiconductor layer is formed of a material comprising one of a material selected from a group consisting of a group III-V Nitride, group III-V Arsenide, group III-V Antimonide, or group II-VI Oxide material.

13. The detection device of claim 1 wherein the second polar semiconductor layer is grown on the first semiconductor layer by an epitaxial process such as MBE or MOCVD.

14. The detection device of claim 1 wherein the second polar semiconductor layer is one of boron nitride, boron aluminum nitride, boron aluminum gallium nitride, aluminum indium gallium nitride, aluminum indium nitride, aluminum nitride that is substantially transparent at wavelengths shorter than approximately 266 nm.

15. The detection device of claim 14 wherein the light detector is a a p-down SiC avalanche photodetector wherein the first semiconductor layer is n-type.

16. A light detector comprising:
a primary semiconductor layer comprising an optically exposed photon reception region;
a secondary semiconductor layer adjacent to and having total polarization different, from the primary semiconductor layer so that an interface charge is induced at the interface between the primary and secondary semiconductor layers; the induced charge reduces or substantially cancels the interface charge caused by the discontinuity of the semiconductor lattice of the primary semiconductor at the interface; and
a photodetection element which converts the photon flux to electric current;
whereby the reduction or cancellation of the interface charge in the primary semiconductor layer increases the collection of photogenerated earners generated by photons having energy larger than the bandgap of the first semiconductor layer by the photodetection element.

17. The detector of claim 16 wherein the secondary semiconductor layer is formed of a material comprising one of a material selected from a group consisting of a group III-V Nitride, group III-V Arsenide, group III-V Antimonide, or group II-VI oxide material.

18. The detector of claim 16, wherein the secondary semiconductor layer has a total polarization that is sufficiently different than the polarization of the primary semiconductor layer such that the induced polarization charge cancels the surface charge associated with the density of surface states in the primary semiconductor layer.

19. A method of improving the quantum efficiency of a semiconductor photodetector comprising:
    providing a semiconductor photodetector having a first layer which has a first interface through which light first enters the semiconductor photodetector;
    placing a layer of polar material transparent to the band of detection wavelengths that has a polarization substantially different than the polarization of the first layer such that the polarization charge induced at the interface between the layer Of polar material and the first surface results in decreased interface recombination of photo-generated minority carriers and an increase in quantum efficiency of the photodetector.

20. The method of claim 19 wherein the semiconductor photodetector is a p-down SiC avalanche photodetector wherein the first layer is n-type and wherein the step of placing a layer of polar material comprises placing a layer of a group III-Nitride material thereon.

* * * * *